US012713877B2

(12) United States Patent
Kim et al.

(10) Patent No.: US 12,713,877 B2
(45) Date of Patent: Aug. 18, 2026

(54) CHUCK ASSEMBLY

(71) Applicant: APET CO., LTD., Pyeongtaek-si (KR)

(72) Inventors: Tae Woo Kim, Hwaseong-si (KR); Sang Su Lee, Osan-si (KR); Jae Hoon Hwang, Yongin-si (KR)

(73) Assignee: APET CO., LTD., Pyeongtaek-si (KR)

( * ) Notice: Subject to any disclaimer, the term of this patent is extended or adjusted under 35 U.S.C. 154(b) by 13 days.

(21) Appl. No.: 18/763,666

(22) Filed: Jul. 3, 2024

(65) Prior Publication Data

US 2025/0010378 A1 Jan. 9, 2025

(30) Foreign Application Priority Data

Jul. 7, 2023 (KR) ........................ 10-2023-0088645

(51) Int. Cl.
*H10P 72/76* (2026.01)
*B23B 31/107* (2006.01)

(52) U.S. Cl.
CPC ........ *H10P 72/7608* (2026.01); *B23B 31/107* (2013.01); *H10P 72/7614* (2026.01); *B23B 2231/46* (2013.01)

(58) Field of Classification Search
CPC ............... H01L 21/683; H01L 21/6838; H01L 21/68721; H01L 21/68728; H01L 21/468728; H01L 21/6875; H01L 21/687; H01L 21/67
See application file for complete search history.

(56) References Cited

U.S. PATENT DOCUMENTS

2011/0146728 A1* 6/2011 Brugger .............. H01L 21/6875 134/32
2015/0200123 A1* 7/2015 Brugger ............ H01L 21/67051 279/124
2016/0141201 A1* 5/2016 Toyomura ......... H01L 21/68728 269/154
2017/0345684 A1* 11/2017 Hohenwarter .... H01L 21/67115

FOREIGN PATENT DOCUMENTS

CN 104576495 B * 7/2017 ....... H01L 21/68721
JP H 09-321012 A 12/1997
JP 2010130021 A * 6/2010 ....... H01L 21/68728
(Continued)

OTHER PUBLICATIONS

Office Action issued in Korean Patent Application No. 10-2023-0088645 on Sep. 16, 2024, including English translation, 10pp.
(Continued)

*Primary Examiner* — Nicole N Ramos
(74) *Attorney, Agent, or Firm* — Womble Bond Dickinson (US) LLP

(57) ABSTRACT

A chuck assembly according to an embodiment of the present invention includes: a rotary table on which a substrate is mounted; a rotating part concentric with a rotation center of the rotary table; and a chuck pin supporting the substrate, wherein the rotary table may include a protrusion protruding upward from a surface facing the substrate, the chuck pin may be coupled to the protrusion in such a way that the protrusion is drawn into the chuck pin, and the protrusion may be provided integrally with the surface of the rotary table facing the substrate.

7 Claims, 7 Drawing Sheets

(56) References Cited

FOREIGN PATENT DOCUMENTS

| | | | |
|---|---|---|---|
| JP | 5933448 | B2 | 6/2016 |
| KR | 10-2009-0045505 | A | 5/2009 |
| KR | 10-1039302 | B1 | 6/2011 |
| KR | 10-1100281 | B1 | 12/2011 |
| KR | 10-2012-0037698 | A | 4/2012 |
| KR | 10-2097009 | B1 | 5/2020 |
| KR | 10-2120066 | B1 | 6/2020 |
| KR | 10-2022-0033903 | A | 3/2022 |
| KR | 10-2406723 | B1 | 6/2022 |
| WO | WO 2011/073842 | A2 | 6/2011 |

OTHER PUBLICATIONS

Notice of Allowance issued in corresponding Korean Patent Application No. 10-2023-0088645, dated Mar. 31, 2025 (with English Translation), 14 pages.

* cited by examiner

CHUCK ASSEMBLY

CROSS-REFERENCE TO RELATED PATENT APPLICATION

The present application claims priority under 35 U.S.C. § 119 (a) to Korean patent application number 10-2023-0088645 filed on Jul. 7, 2023, in the Korean Intellectual Property Office, the entire disclosure of which is incorporated by reference herein.

BACKGROUND OF THE INVENTION

1. Field

Embodiments of the present invention relate to a chuck assembly for support of a semiconductor substrate.

2. Description of the Related Art

In general, a semiconductor manufacturing process includes etching and cleaning a semiconductor substrate. During processes, contaminants such as various particles and metal impurities may remain on the substrate, and since the contaminants adversely affect yield and reliability of semiconductor devices, a cleaning process to remove the contaminants remaining on the substrate is essentially performed when manufacturing semiconductors.

The semiconductor substrate may be placed on a rotary table and rotated at high speed, and cleaning may be performed to remove the contaminants by supplying a fluid, such as a processing solution or a cleaning solution, to the substrate which is rotating at high speed.

The rotary table is provided with a plurality of chuck pins to support the substrate, and the chuck pin may be moved by a moving means provided on the rotary table between a support position where the substrate is supported and fixed, and a standby position where the chuck pin is spaced apart from the substrate.

In the prior art, as the chuck pin was moved to the support position or standby position by the moving means, a gap occurred at a point where the chuck pin and the rotary table were connected, and in order to minimize this, it was necessary to add a connecting member such as a gasket between the chuck pin and the rotary table.

Even if the connecting member is added, there are problems in that a gap with the rotary table or chuck pin may occur during a manufacturing quality or assembly process, if they are made of different materials, the thermal expansion coefficients are different, so they may be deformed into different shapes by a high-temperature fluid flowing into the gap, and even if they are made of the same material, the thickness and shape are different, so new gaps may appear or gaps may widen during use.

When the fluid flows into the gap, the connecting member becomes loose and deformed according to the thermal expansion of the fluid, causing a problem in which the chuck pin cannot properly support the substrate.

SUMMARY OF THE INVENTION

To solve the problems of the prior art, embodiments of the present invention provide a chuck assembly with a structure which prevents creation of a gap through a protrusion formed integrally with a rotary table and in which inflow of fluid is further blocked through a cover covering the protrusion, so that the fluid does not flow into the rotary table even when the chuck pin moves to the support position and the standby position.

A chuck assembly according to an embodiment of the present invention includes: a rotary table on which a substrate is mounted; a rotating part concentric with a rotation center of the rotary table; and a chuck pin supporting the substrate, wherein the rotary table may include a protrusion protruding upward from a surface facing the substrate, the chuck pin may be coupled to the protrusion in such a way that the protrusion is drawn into the chuck pin, and the protrusion may be provided integrally with the surface of the rotary table facing the substrate.

Specifically, the protrusion may be formed of the same material as the surface and provided vertically with respect to the surface, and may be in contact with and coupled to the chuck pin on inner and outer surfaces at the same time.

Specifically, the chuck pin may include a cover which is coupled to the outer surface and an upper surface of the protrusion and supports the substrate, and one end of the cover may surround the outer surface of the protrusion and the other end may support the substrate, thereby preventing fluid supplied to the rotary table from flowing horizontally into the inner surface of the protrusion on the rotary table.

Specifically, the cover may include a first contact point which contacts the upper surface of the protrusion on an inner surface of the cover; and a second contact point which contacts the protrusion at a lower position than the first contact point on the inner surface, and wherein, even if the fluid has a height around the protrusion due to continuous supply of the fluid and some of the fluid flows vertically into the second contact point, the first contact point may be provided at a higher position than the second contact point and may be horizontally spaced apart from the second contact point to prevent the fluid from reaching the first contact point.

Specifically, the protrusion may include a first protrusion which is formed integrally with the rotary table and protrudes vertically upward with respect to the rotary table; and a second protrusion which is formed integrally with the rotary table and the first protrusion and extends downward from the first protrusion, and wherein an inner surface of the second protrusion may surround the chuck pin and an outer surface of the second protrusion may be surrounded by an opening provided in the substrate.

Specifically, the chuck assembly may further include a hinge part disposed inside the rotary table; and an ascending and descending part which is hinged to the hinge part and moves up and down in a direction perpendicular to the direction of rotation of the rotary table, wherein the chuck pin may move in a direction toward the rotation center of the rotary table or in the opposite direction in a hinged manner as the ascending and descending part moves up and down.

Specifically, as the ascending and descending part descends, a cover of the chuck pin may move in the direction toward the rotation center of the rotary table in a hinged manner to support the substrate, and as the ascending and descending part ascends, the cover may move in the direction opposite to the rotation center of the rotary table in a hinged manner, so that the cover may be spaced apart from the substrate.

A chuck assembly according to another embodiment of the present invention includes: a rotary table on which a substrate is seated; a rotating part which rotates the rotary table; and a chuck pin which supports the substrate, wherein the rotary table may have a surface facing the substrate and include a plurality of protrusions protruding upward from a circumference of the surface, the chuck pin may be provided on the protrusion in a form surrounding an outer periphery of the protrusion, and the surface and the plurality of protrusions may be formed integrally.

Specifically, each of the plurality of protrusions may have a hollow shape, the chuck pin may be provided in a form that is inserted into the protrusion and surrounds the outer periphery of the protrusion, so that the chuck pin may be in contact with inside and outside of the protrusion at the same time.

Specifically, the surface and the plurality of protrusions may be integrally formed of a single material, and the plurality of protrusions may protrude downward from the surface on an extension line that protrudes upward from the surface.

A chuck assembly according to the present invention can prevent fluid from flowing into an opening between a chuck pin and a rotary table at a point where they are connected, even when the position of the chuck pin changes.

DETAILED DESCRIPTION

Figure 1:
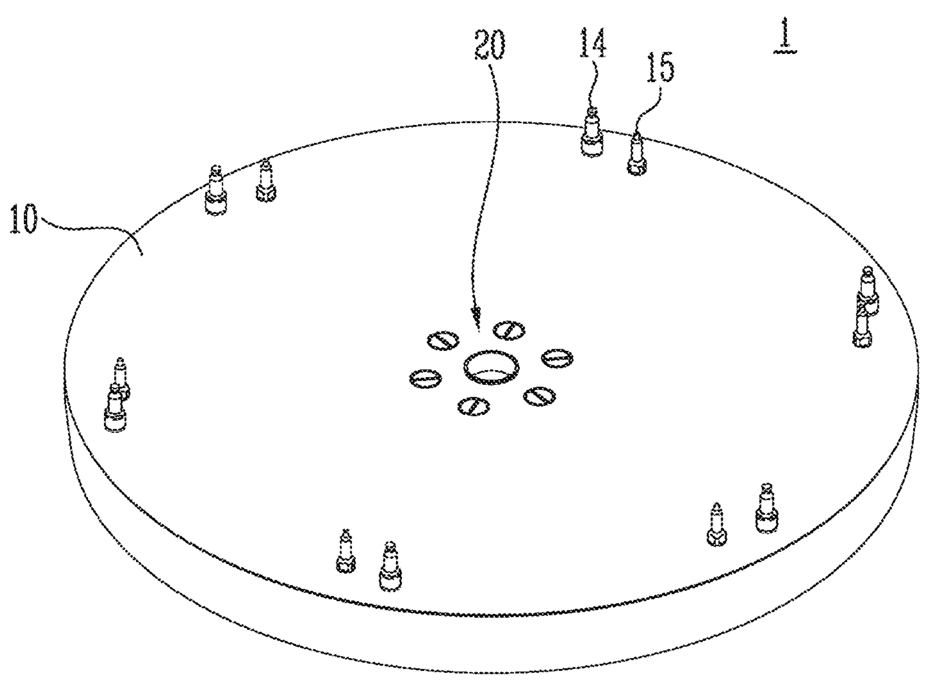
FIG. 1 is a perspective view illustrating an upper surface on which a substrate is placed in a chuck assembly according to one embodiment of the present invention.

The objectives, specific advantages, and novel features of the present invention will become more apparent from the following detailed description and preferred embodiments taken in conjunction with the accompanying drawings. In this specification, when adding reference numerals to components in each drawing, it should be noted that identical components are given the same numeral as much as possible even if they are shown in different drawings. Further, in describing the present invention, if it is determined that a detailed description of related known technologies may unnecessarily obscure the gist of the present invention, the detailed description will be omitted.

In addition, the accompanying drawings are merely for easy understanding of the embodiments disclosed in the present specification, and the technical idea disclosed in the present specification is not limited by the accompanying drawings, and it should be understood that all changes, equivalents, and substitutes included in the spirit and technical scope of the present invention are included.

Figure 2:
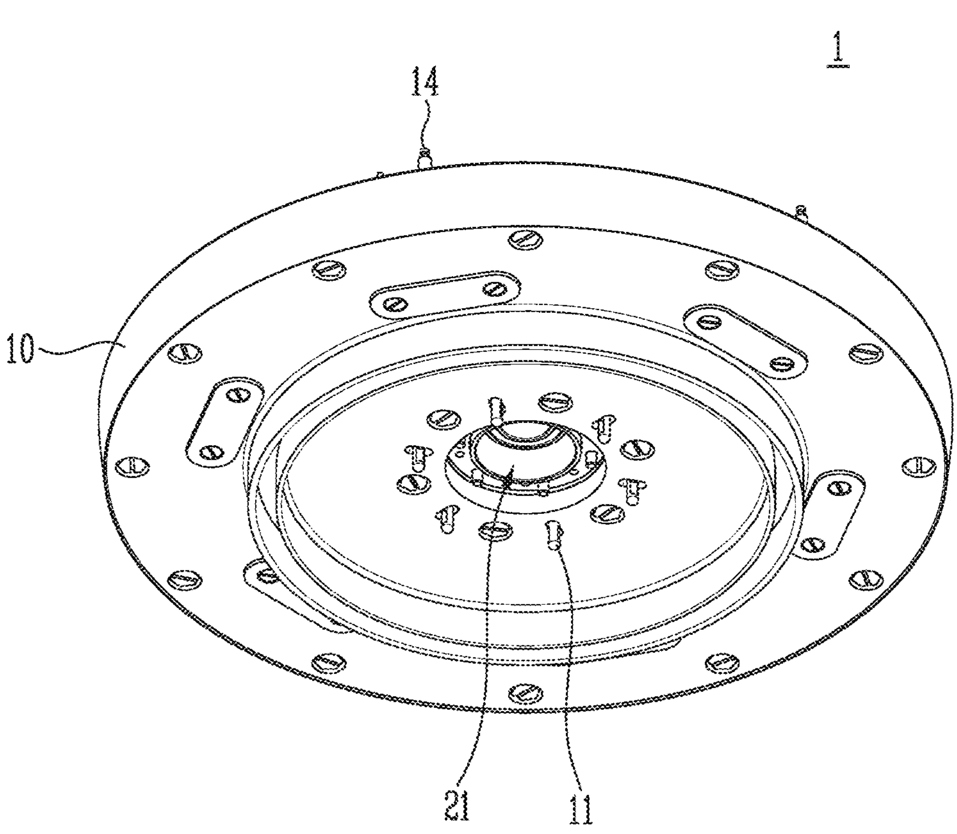
FIG. 2 is a perspective view illustrating a lower surface of a chuck assembly according to one embodiment of the present invention.
Figure 3:
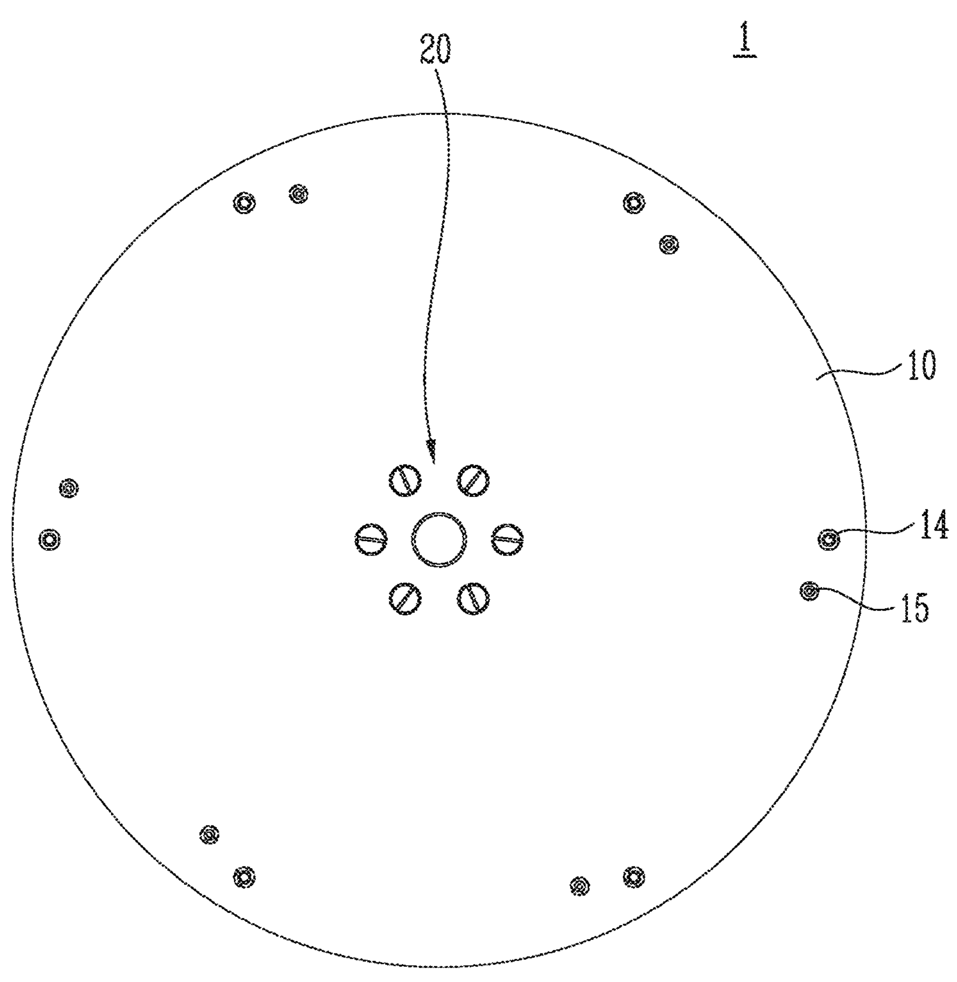
FIG. 3 is a plan view illustrating an upper surface on which a substrate is placed in a chuck assembly according to one embodiment of the present invention.
Figure 4:
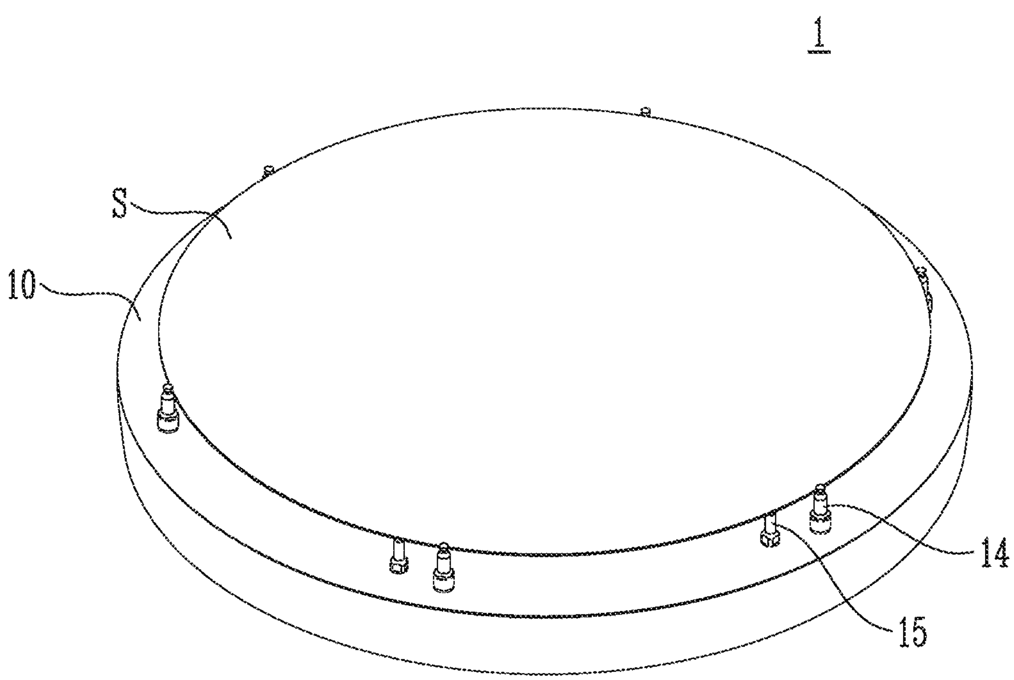
FIG. 4 is a perspective view illustrating an upper surface on which a substrate is supported in a chuck assembly according to one embodiment of the present invention.
Figure 5:
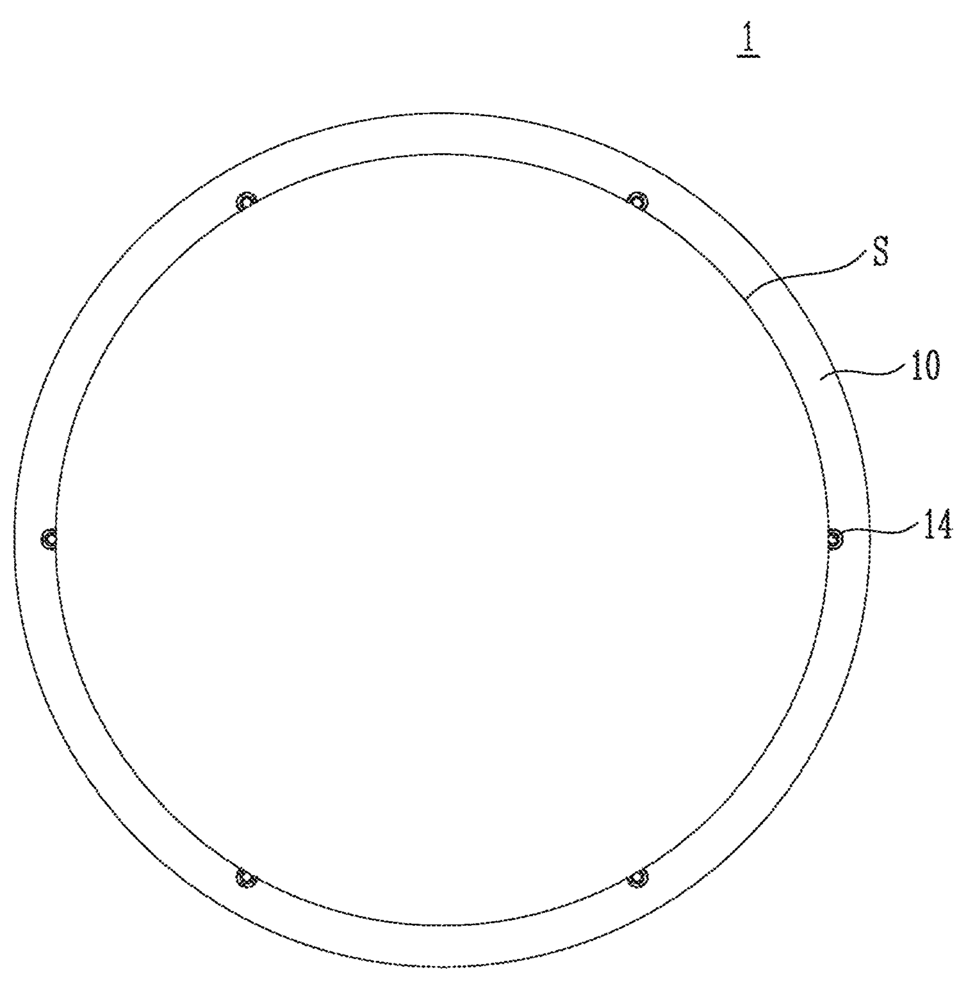
FIG. 5 is a plan view illustrating an upper surface on which a substrate is supported in a chuck assembly according to one embodiment of the present invention.
Figure 6:
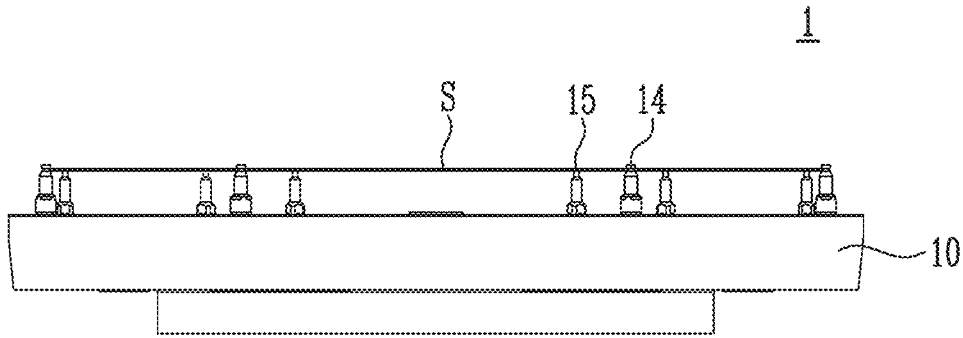
FIG. 6 is a side view illustrating a substrate supported in a chuck assembly according to one embodiment of the present invention.
Figure 7:
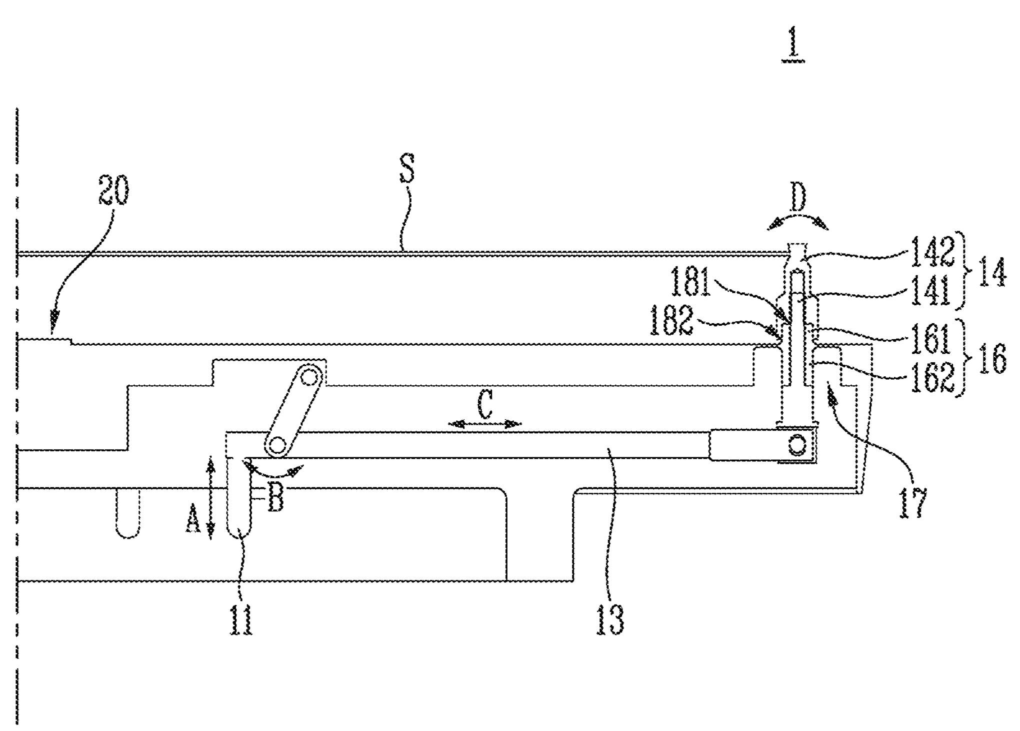
FIG. 7 is a partial cross-sectional diagram illustrating a substrate supported in a chuck assembly according to one embodiment of the present invention.

FIG. 1 is a perspective view illustrating an upper surface on which a substrate is placed in a chuck assembly according to one embodiment of the present invention, FIG. 2 is a perspective view illustrating a lower surface of a chuck assembly according to one embodiment of the present invention, FIG. 3 is a plan view illustrating an upper surface on which a substrate is placed in a chuck assembly according to one embodiment of the present invention, FIG. 4 is a perspective view illustrating an upper surface on which a substrate is supported in a chuck assembly according to one embodiment of the present invention, FIG. 5 is a plan view illustrating an upper surface on which a substrate is supported in a chuck assembly according to one embodiment of the present invention, FIG. 6 is a side view illustrating a substrate supported in a chuck assembly according to one embodiment of the present invention, and FIG. 7 is a partial cross-sectional diagram illustrating a substrate supported in a chuck assembly according to one embodiment of the present invention.

Referring to FIG. 1, a chuck assembly 1 may include a rotary table 10, a rotating part 20, a chuck pin 14, and a support pin 15.

The rotary table 10 provides a place for mounting a substrate S on one surface and may have a plurality of openings 17 arranged radially around the rotating part 20, and the chuck pin 14, which will be described later, may be disposed in each opening 17.

The chuck pin 14 may be placed to protrude and extend from the one surface of the rotary table 10, and thus the one surface of the rotary table 10 and the substrate S may be spaced apart by a predetermined distance by the chuck pin 14. The side of the substrate S may be mounted on the rotary table 10 by the chuck pin 14, and the lower surface of the substrate S may be supported by the support pin 15 so that the substrate S can rotate with the rotary table 10 by the rotating part 20, which will be described later.

The chuck pin 14 may be moved to a support position or a standby position according to movement of an ascending and descending part 11 which will be described later. The chuck pin 14 may mount the substrate S on the rotary table 10 at the support position, and when the chuck pin 14 moves to the standby position, the substrate, although supported by the support pin 15 on its lower surface, is disposed apart from the chuck pin 14 and may therefore be removed from the rotary table 10.

The number and location of the chuck pin(s) 14 are not limited, and referring to FIG. 1, the support pin 15 may be provided around the chuck pin 14, but the number and location of the support pin(s) 15 are not limited.

The support pin 15 is spaced apart from the chuck pin 14, and is placed between the chuck pin 14 and a rotation center of the rotary table 10 to support the lower surface of the substrate S. When the chuck pin 14 is moved to the standby position, the chuck pin 14 and the substrate S are spaced apart, and the support pin 15 may support the lower surface of the substrate S to allow the substrate S to be spaced apart from the rotary table 10.

The support pin 15 may be hinged to a link part 13, which will be described later, and may move to a support position or a standby position like the chuck pin 14, so that it can perform the same function as the chuck pin 14 when a substrate S of a different size is mounted.

The rotary table 10 may have a disk shape, but is not limited thereto and may also have an asymmetric shape that can be rotated.

The rotating part 20 may be provided at the center of the rotary table 10, and the rotary table 10 may rotate with the rotating part 20 as the rotation center, so that the rotating part 20 may include a rotation axis 21 that is the center of rotation. The rotating part 20 may rotate about the center or a biased eccentricity of a cross-section depending on the position where the rotation axis 21 is provided.

Referring to FIG. 2, on the surface of the rotary table 10 opposite to the one surface on which the substrate S is mounted, the rotation axis 21 forming the rotation center of the rotary table 10 and the ascending and descending part 11 may be provided.

The rotation axis 21 may rotate the rotary table 10 by receiving power by a driving part (not shown) which will be described later, and the ascending and descending part 11 provided around the rotation axis 21 may move the chuck pin 14 or support pin 15 to the support position or standby position.

The ascending and descending part 11 may change the position of the chuck pin 14 or the support pin 15 by receiving power from the driving part, and may change the positions of a plurality of chuck pins 14 or a plurality of support pins 15 with a single operation.

Referring to FIG. 3, the plurality of chuck pins 14 may be arranged radially along the circumference of the rotary table 10. The plurality of chuck pins 14 may be disposed in positions symmetrical to each other with respect to the rotating part 20, so that the substrate S can be stably supported.

The chuck pin 14 may be placed at the edge of the rotary table 10, but is not limited thereto, and the diameter of the substrate S that can be placed may be determined depending on the position of the chuck pin 14.

Since the support pin 15 is provided closer to the rotation axis 21 than the chuck pin 14, when the side of the substrate S having a large diameter is supported by the chuck pin 14, the support pin 15 may support the substrate S from the lower surface, and the support pin 15 may support the substrate S having a small diameter from the side.

Referring to FIG. 4, the chuck pin 14 may be placed to protrude and extend through one surface of the rotary table 10. One end of the chuck pin 14 may be disposed inside the rotary table 10, and the other end may protrude and extend through one surface of the rotary table 10.

The other end of the chuck pin 14 may support the substrate S, and a cover 142 of the chuck pin 14 may support the substrate S. Details will be described in relation to FIG. 7.

Referring to FIG. 6, the plurality of chuck pins 14 provided on the rotary table 10 may be arranged to be spaced apart from each other such that the other ends of the chuck pins can support the substrate S in a horizontal state, and thus the substrate S may be spaced apart from one surface of the rotary table 10 by a predetermined distance.

FIG. 7 is a partial cross-sectional diagram illustrating the substrate S supported in the chuck assembly 1 according to one embodiment of the present invention, and shows an enlarged portion of a cross-section of the chuck assembly 1 to illustrate a method of operating the chuck pin 14 in the chuck assembly 1 according to one embodiment of the present invention.

Referring to FIG. 7, the chuck assembly 1 may include the ascending and descending part 11, a hinge part (not shown), the link part 13, the chuck pin 14, a protrusion 16, and contact points 181 and 182.

One or more openings 17 are formed on one surface of the rotary table 10 on which the substrate S is mounted, and the chuck pin 14 is placed in the opening 17. The diameter of the opening 17 is provided to be larger than the diameter of the chuck pin 14, so that the chuck pin 14 can be moved to the support position or the standby position within the opening 17.

The chuck pin 14 may be placed in a direction perpendicular to the direction of rotation of the rotary table 10, so that the chuck pin 14 may be placed in a direction perpendicular to the one surface of the rotary table 10 on which the substrate S is mounted.

One end of the chuck pin 14 is connected to the link part 13 provided inside the rotary table 10, and the other end may be provided to support the substrate S. The one end of the chuck pin 14 may be hinged to the link part 13, so that the chuck pin 14 may be moved to the support position or the standby position according to movement of the ascending and descending part 11, which will be described later.

As the link part 13, which will be described later, is moved by the ascending and descending part 11, the chuck pin 14 hinged to the link part 13 may be moved to the support position or the standby position in a hinged manner.

The other end of the chuck pin 14 may have a shape corresponding to the edge of the substrate S so as to support the side or edge of the substrate S when the chuck pin 14 is in the support position. The other end of the chuck pin 14 may have a structure to support the substrate S so that, when the chuck pin 14 is in the support position, the substrate S does not move in the direction of the rotary table 10 and in a direction opposite to the center of the rotary table 10.

For example, the other end of the chuck pin 14 may have a groove (not shown) into which at least one surface of the edge of the substrate S can be inserted, but is not limited thereto.

Accordingly, when the plurality of chuck pins 14 support the substrate S in the support position, the substrate S does not deviate at least in the direction of the rotary table 10 and in the direction opposite to the center of the rotary table 10.

Referring to FIG. 7, the ascending and descending part 11 is arranged to extend through one surface of the rotary table 10, and is provided to move up and down with respect to the one surface. For example, ascending and descending movement refers to movement in the A direction. One end of the ascending and descending part 11 may be connected to the driving part (not shown) and may be provided to move up and down by the driving part. The other end of the ascending and descending part 11 may be hinged to the hinge part.

The hinge part is provided so that one end of the hinge part is hinged to the ascending and descending part 11 and the other end is hinged to an inner wall of the rotary table 10. As the ascending and descending part 11 moves up and down in the A direction, the hinge part may be moved in the B direction around its coupling portion to the inner wall in a hinged manner.

The hinge part may be provided with a spring (not shown), and the spring may be compressed as the ascending and descending part 11 ascends and descends, and when an external force on the ascending and descending part 11 is removed, the spring may expand to return the hinge part to its original position and lower the ascending and descending part 11.

The link part 13 may be disposed in parallel with the direction of the rotation center of the rotary table 10 inside the rotary table 10 and is capable of horizontal movement in the direction of the rotation center of the rotary table 10, and the link part 13 may be provided such that one end of the link part 13 is coupled to a portion where the ascending and descending part 11 and the hinge part are hinged. Alternatively, one end of the link part 13 may be coupled to any one of the ascending and descending part 11 and the hinge part.

Accordingly, the link part 13 is provided to move according to the ascending and descending movement of the ascending and descending part 11 or the hinge movement of the hinge part. The link part 13 may be provided so that the other end of the link part 13 is hinged to the chuck pin 14. The other end of the link part 13 may be hinged to one end of the chuck pin 14. As the hinge part moves in the B direction, the link part 13 may move horizontally in the C direction.

One end of the chuck pin 14 may be hinged to the link part 13, and as the link part 13 moves in the C direction, the chuck pin 14 may be moved in the D direction in a hinged manner.

When an external force by the driving part is applied to one end of the ascending and descending part 11 in the direction of the rotary table 10, the ascending and descending part 11 may ascend and descend (A direction) with respect to one surface of the rotary table 10.

As the ascending and descending part 11 ascends, the other end of the ascending and descending part 11 ascends and descends, and the hinge part moves in a hinged manner (B direction). One end of the hinge part connected to the ascending and descending part 11 moves toward the center of the rotary table 10 in a hinged manner.

As one end of the hinge part moves in the hinged manner, the link part 13 connected to the hinge part moves horizontally (C direction), and the link part 13 moves toward the center of the rotary table 10.

As the link part 13 moves, the chuck pin 14 connected to the other end of the link part 13 moves in a hinged manner (D direction). The other end of the chuck pin 14 to support the substrate S moves in the direction opposite to the center of the rotary table 10 in a hinged manner.

In this way, when the ascending and descending part 11 ascends and descends, the other end of the chuck pin 14 moves in the direction opposite to the rotation center of the rotary table 10 in a hinged manner, and when the ascending and descending part 11 ascends and descends, the chuck pin 14 may be spaced apart from the substrate S. In other words, when the ascending and descending part 11 ascends and descends, the chuck pin 14 moves to the standby position.

When the external force on the end of the ascending and descending part 11 is removed, the ascending and descending part 11 may move downward (A direction) with respect to one surface of the rotary table 10, and the hinge part may move in a hinged manner to return to its original position (B direction) by the elastic force of the spring of the hinge part, so that the ascending and descending part 11 may move downward.

As each of the ascending and descending part 11 and the hinge part moves to its original position, the link part 13 connected to the hinge part moves horizontally (C direction). The link part 13 is moved in the direction opposite to the center of the rotary table 10. As the link part 13 moves, the chuck pin 14 connected to the other end of the link part 13 moves in a hinged manner (D direction), and the other end of the chuck pin 14 to support the substrate S is moved toward the center of the rotary table 10 in a hinged manner.

In this way, when the ascending and descending part 11 descends, the other end of the chuck pin 14 may move toward the rotation center of the rotary table 10 in the hinged manner, so that the chuck pin 14 can contact and support the substrate S when the ascending and descending part 11 descends. In other words, when the ascending and descending part 11 descends, the chuck pin 14 moves to the support position.

Referring to FIG. 7, the configuration of the chuck pin 14 and the protrusion 16 surrounding the chuck pin 14 may be different from that of a conventional chuck pin. One end of the chuck pin 14 may be hinged to the link part 13 and the other end may support the substrate S, and a body 141 of the chuck pin 14 may be hinged to the link part 13 and the cover 142 of the chuck pin 14 may support the substrate S.

The body 141 may be hinged to the link part 13 and may be inserted into the opening 17 and moved to the support position or the standby position together with the cover 142 supporting the substrate S, and the body 141 and the cover 142 are included in the chuck pin 14 and may be referred to as the chuck pin 14.

The chuck pin 14 may be coupled to the protrusion 16 so that the protrusion 16 is drawn into the chuck pin 14, or may be provided on the protrusion 16 in a form surrounding the outer periphery of the protrusion 16, and the chuck pin 14 may include the cover 142, which will be described later.

The body 141 may be supported by the inner surface of the protrusion 16 protruding with respect to the rotary table 10, and may have a thickness that varies along the longitudinal direction in order to protrude a predetermined distance relative to the rotary table 10.

The body 141 may have different thicknesses at a section where it is coupled to the protrusion 16 and at a section between the protrusion 16 and the link part 13, and the thickness of the section where it is coupled to the protrusion 16 is thinner and the section between the protrusion 16 and the link portion 13 is thicker, so that a change in relative position of the body 141 with respect to the protrusion 16 may be prevented through the difference in thickness.

The body 141 may be hinged to the link part 13 and may be moved to the support position or the standby position, and an outer surface of the body 141 and an inner surface of the protrusion 16 may move together by the link part 13 while in contact with each other.

The body 141 may partially protrude with respect to the protrusion 16 integrated with the rotary table 10 and may be coupled to the cover 142 at its end, and the body 141 may be blocked from the outside by the cover 142 coupled at its end and the protrusion 16, so it may not come into contact with fluid.

The cover 142 may simultaneously couple with the body 141 protruding from the rotary table 10 and the rotary table 10 and support the substrate S, and may be connected to an end of the body 141 to support the side or edge of the substrate S. As the cover 142 is connected to the end of the body 141, the cover may be moved together with the body 141 to the support position or the standby position, and the cover 142 may be coupled to the protrusion 16 that protrudes vertically from the rotary table 10.

Referring to FIG. 7, the inner surface of the cover 142 may be provided in multiple stages and may include a stage equal to the thickness of the body 141 and a stage equal to the thickness of the protrusion 16.

The inner surface of the cover 142 may be coupled with the body 141 and the protrusion 16, and may include a first contact point 181 that simultaneously contacts the body 141 and the protrusion 16 on the inner surface of the cover 142 and a second contact point 182 that contacts the protrusion 16 at a lower position than the first contact point 181 on the inner surface.

The first contact point 181 may be provided on the inner surface of the cover 142 at the stage equal to the thickness of the body 141, and the second contact point 182 may be provided on the inner surface of the cover 142 at the stage equal to the thickness of the protrusion 16.

The first contact point 181 may be provided higher than the second contact point 182 in the height direction of the vertical rotary table 10, but may be provided to be offset from each other in the horizontal direction, so that the first contact point 181 and the second contact point 182 may be spaced apart in the horizontal direction.

Cleaning may be performed by supplying a predetermined amount of fluid, such as a processing solution or a cleaning solution, or by supplying it continuously, to the substrate S that is rotating at high speed. During this process, the fluid may flow down from the substrate S and be supplied to the rotary table 10.

The conventional chuck pin used a separate connecting member such as an O-ring to prevent fluid provided on the rotary table 10 from flowing into the rotary table 10, and there was a problem in that the fluid flowed into a gap provided to connect the rotary table 10 and the connecting member, and the gap widened due to thermal expansion of the fluid, causing the connection with the rotary table 10 to become loose.

When the rotary table 10 and the connecting member are made of different materials, the thermal expansion coefficients may be different, resulting in a gap opening, and in order to prevent this, they are sometimes made of the same material.

When the rotary table 10 and the connecting member are made of the same material, even if the rotary table 10 and the connecting member are initially prepared without a gap, their thickness, shape, etc. are different from each other, and thus the moving distance may be different according to the movement of the chuck pin 14 by the link part 13, and as a result, a gap may occur.

The chuck assembly 1 according to one embodiment of the present invention uses the protrusion 16 integrally formed with the rotary table 10 as the connecting member to the rotary table 10. Therefore, a connection process required when the protrusion 16 is provided separately from the rotary table 10 is not necessary, so no gap may occur.

In addition, since the protrusion 16 protrudes vertically with respect to the rotary table 10 and the outer surface of the protrusion 16 and the inner surface of the cover 142 are coupled, the inflow of fluid may be prevented as much as possible even if some fluid flows in.

The protrusion 16 may provided integrally with the surface on the rotary table 10 facing the substrate S, and a plurality of the protrusions 16 may be disposed upward from the circumference of the surface. The protrusion 16 may be provided in a hollow shape and may be coupled to the chuck pin 14 from the inside, so that it may be coupled to the chuck pin 14 at the same time on the inner and outer surfaces.

The protrusion 16 may be formed integrally with the rotary table 10 and may include a first protrusion 161 that protrudes vertically upward with respect to the rotary table 10 and a second protrusion 162 that extends downward.

Since the first protrusion 161 is integrally formed with the rotary table 10, no additional process of connecting it to the rotary table 10 is required and no gaps may occur. The first protrusion 161 may protrude vertically upward with respect to the rotary table 10, so that inflow of fluid provided on the rotary table 10 may be prevented by a height difference.

Since the inner surface of the first protrusion 161 surrounds the body 141 and the outer surface of the first protrusion 161 is surrounded by the cover 142, the first protrusion 161, together with the cover 142, may double protect the body 141 and prevent the fluid from reaching the body 141.

The second protrusion 162 may be formed integrally with the rotary table 10 and the first protrusion 161, and may extend downward from the first protrusion 161. Referring to FIG. 7, the second protrusion 162 may have the same shape as the first protrusion 161, so that the first protrusion 161 and the second protrusion 162 may extend up and down, respectively, around the rotary table 10.

The inner surface of the second protrusion 162 may surround the body 141 and the outer surface may be surrounded by the opening 17, so that the second protrusion 162 may move together with the body 141 to the support position or the standby position. The second protrusion 162 may come into contact with the portion of the body 141 whose thickness varies, thereby preventing relative movement of the body 141 with respect to the second protrusion 162, so that the body 141 and the protrusion 16 may move together.

Referring to FIG. 7, the portion where the rotary table 10 and the outer surface of the first protrusion 161 are connected may be formed to have a curve or curvature. Fluid may be provided to the rotary table 10 by the fluid supplied to the substrate S. If the fluid is continuously supplied, the fluid provided on the rotary table 10 may cohere and have a height.

On the rotary table 10, the fluid may cohere at a connection site, such as the portion where the rotary table 10 and the outer surface of the first protrusion 161 are connected, and the connection site may be formed to have a curve or curvature to prevent the cohesion of the fluid.

The chuck assembly 1 according to one embodiment of the present invention may prevent fluid provided on the rotary table 10 from flowing into the rotary table 10 as much as possible, as described below.

Since the rotary table 10 and the protrusion 16 are formed integrally, so there is no gap between the rotary table 10 and the protrusion 16, fluid cannot flow through a gap. Further, the first protrusion 161 of the protrusion 16 protrudes upward from the rotary table 10 to have a height, thereby preventing the fluid provided on the rotary table 10 from flowing in due to the height difference.

The cover 142 coupled to the end of the body 141 is coupled to the first protrusion 161 on the inner surface and the cover 142 is coupled to cover the first protrusion 161 from top to bottom to prevent inflow of fluid supplied from the top of the first protrusion 161.

Referring to FIG. 7, the cover 142 may include the first contact point 181 that contacts the body 141 and the first protrusion 161 at the same time and the second contact point 182 that contacts the first protrusion 161 at a lower position than the first contact point 181. Since the second contact point 182 is adjacent to the rotary table 10, if the fluid has a height, some of the fluid may flow into the second contact point 182.

If the fluid is continuously supplied onto the rotary table 10, the fluid may cohere and have a height. But, since the first protrusion 161 protrudes vertically upward from the rotary table 10, the fluid may be prevented from flowing horizontally into the rotary table 10.

If the fluid has a height, the fluid may flow vertically into the second contact point 182, which is the point where the cover 142 and the first protrusion 161 are coupled. However, the portion where the first protrusion 161 and the rotary table 10 are connected may be formed to have the curve or curvature to minimize the fluid flowing into the second contact point 182.

Since the first contact point 181 is provided at a higher position than the second contact point 182 and is spaced apart horizontally from the second contact point 182 so that they are not provided on the same vertical line, it is possible to prevent fluid flowing in from the second contact point 182 from easily reaching the first contact point 181.

In order for the fluid flowing into the second contact point 182 to reach the first contact point 181 in contact with the body 141, the fluid must move vertically at the second contact point 182 and then bend and move horizontally to reach the first contact point 181. Accordingly, it is possible to prevent the fluid flowing into the second contact point 182 from reaching the first contact point 181 or the body 141.

The chuck assembly 1 according to one embodiment of the present invention includes many measures that prevent fluid from flowing into the rotary table 10, and thus, unlike the conventional chuck assembly 1, the chuck assembly 1 may prevent deformation of the connecting member due to the fluid.

A portion of the rotary table 10 provided around the chuck pin 14 and at the top of the opening 17 has a thinner thickness than the thickness of the rotary table 10 disposed at another position, so it can be moved. Therefore, when the chuck pin 14 moves, the protrusion 16 formed integrally with the rotary table 10 may move together.

Even if the fluid on the rotary table 10 penetrates or flows into the gap, when the temperature of the fluid is at room temperature, no significant deformation may occur in the gap. However, when the temperature of the fluid is high, such as 70 degrees or higher, if the fluid penetrates or flows into the gap, the temperature of the fluid may cause deformation of a member forming the gap, and according to the shape and material of each member, different forms of deformation may be caused and the gap may widen, which may result in further deformation.

The present invention is not limited to the embodiments described above, and may include a combination of the embodiments and a known technology as another embodiment.

Although the present invention has been described in detail through specific example embodiments, this is for detailed explanation of the present invention, and the present invention is not limited thereto, and it would be clear that modifications and improvements can be made by a person skilled in the art within the technical idea of the present invention.

All simple modifications or changes of the present invention fall within the scope of the present invention, and the specific scope of protection of the present invention will be made clear by the appended claims.

What is claimed is:

1. A chuck assembly comprising:

a rotary table on which a substrate is mounted;

a rotating part concentric with a rotation center of the rotary table; and a chuck pin supporting the substrate, wherein the rotary table comprises a protrusion protruding upward from a surface of the rotary table facing the substrate, the chuck pin is coupled to the protrusion in such a way that the protrusion is drawn into the chuck pin, and the protrusion is provided integrally with the surface of the rotary table facing the substrate, wherein the chuck pin comprises a cover and a body, and the body extends upward from the protrusion and into the cover.

2. The chuck assembly according to claim 1, wherein the protrusion is formed of a same material as the surface of the rotary table and provided vertically with respect to the surface, and is in contact with and coupled to the chuck pin on inner and outer surfaces of the protrusion at the same time.

3. The chuck assembly according to claim 2, wherein the cover is coupled to the outer surface and an upper surface of the protrusion and supports the substrate, and one end of the cover surrounds the outer surface of the protrusion and the other end supports the substrate, thereby preventing fluid supplied to the rotary table from flowing horizontally into the inner surface of the protrusion on the rotary table.

4. The chuck assembly according to claim 3, wherein the cover comprises:

a first contact point which contacts the upper surface of the protrusion on an inner surface of the cover; and a second contact point which contacts the protrusion at a lower position than the first contact point on the inner surface, and wherein, even if the fluid has a height around the protrusion due to continuous supply of the fluid and some of the fluid flows vertically into the second contact point, the first contact point is provided at a higher position than the second contact point and is horizontally spaced apart from the second contact point to prevent the fluid from reaching the first contact point.

5. The chuck assembly according to claim 2, wherein the protrusion comprises:

a first protrusion which is formed integrally with the rotary table and protrudes vertically upward with respect to the rotary table; and a second protrusion which is formed integrally with the rotary table and the first protrusion and extends downward from the first protrusion, and wherein an inner surface of the second protrusion surrounds the chuck pin and an outer surface of the second protrusion is surrounded by an opening provided in the substrate.

6. The chuck assembly according to claim 5, further comprising:

a hinge part disposed inside the rotary table; and an ascending and descending part which is hinged to the hinge part and moves up and down in a direction perpendicular to the direction of rotation of the rotary table, wherein the chuck pin moves in a direction toward the rotation center of the rotary table or in the opposite direction in a hinged manner as the ascending and descending part moves up and down.

7. The chuck assembly according to claim 6, wherein, as the ascending and descending part descends, the cover of the chuck pin moves in the direction toward the rotation center of the rotary table in a hinged manner to support the substrate, and as the ascending and descending part ascends, the cover moves in the direction opposite to the rotation center of the rotary table in a hinged manner, so that the cover is spaced apart from the substrate.

* * * * *